United States Patent [19]
Kato

[11] Patent Number: 5,654,209
[45] Date of Patent: Aug. 5, 1997

[54] METHOD OF MAKING N-TYPE SEMICONDUCTOR REGION BY IMPLANTATION

[75] Inventor: Juri Kato, Suwa, Japan

[73] Assignee: Seiko Epson Corporation, Tokyo, Japan

[21] Appl. No.: 325,631

[22] Filed: Oct. 19, 1994

Related U.S. Application Data

[63] Continuation of Ser. No. 203,497, Feb. 28, 1994, abandoned, which is a continuation of Ser. No. 819,775, Jan. 13, 1992, abandoned, which is a division of Ser. No. 700,890, May 10, 1991, abandoned, which is a continuation of Ser. No. 379,438, Jul. 12, 1989, abandoned.

[30] Foreign Application Priority Data

| Jul. 12, 1988 | [JP] | Japan | 63-174107 |
| Jul. 12, 1988 | [JP] | Japan | 63-174111 |
| Jul. 18, 1988 | [JP] | Japan | 63-177288 |
| Jul. 28, 1988 | [JP] | Japan | 63-189211 |
| Jul. 28, 1988 | [JP] | Japan | 63-189212 |
| Apr. 21, 1989 | [JP] | Japan | 64-102280 |

[51] Int. Cl.$^6$ .................................................. H01L 21/26
[52] U.S. Cl. ........................... 438/528; 438/659; 438/385
[58] Field of Search ................................ 437/24, 26, 27

[56] References Cited

U.S. PATENT DOCUMENTS

| 4,144,100 | 3/1979 | MacIver et al. . |
| 4,584,026 | 4/1986 | Wu et al. . |
| 4,682,407 | 7/1987 | Wilson et al. . |

FOREIGN PATENT DOCUMENTS

| 0035598 | 9/1981 | European Pat. Off. . |
| 56-118332 | 12/1991 | Japan . |
| 8500694 | 2/1985 | WIPO . |

OTHER PUBLICATIONS

"Direct Evidence of Arsenic Clustering in High Dose Arsenic–Implanted Silicon", *Appl. Phys. Lett.*, vol. 44, No. 8, Apr. 15, 1984, by N.R. Wu, D.K. Sadana, and J. Washburn.

*Primary Examiner*—George Fourson
*Attorney, Agent, or Firm*—Loeb & Loeb LLP

[57] ABSTRACT

A semiconductor device at least including a region which contains a first impurity constituted by a group V element and a second impurity constituted by an element of high electronegativity or a halogen element such as Ti, Cl, O, Br, S, I or N in amorphous silicon, polycrystalline silicon, single crystal silicon, a refractory metal such as Ti, Mo, W, Ta, Pt, Pd and Zr or a silicide of such refractory metal. The semiconductor device is manufactured by introducing the second impurity before, after or during introduction of the first impurity, for example, by ion implantation into amorphous, polycrystalline or single crystal silicon, a refractory metal, or a silicide thereof and then annealing to form an N-type impurity region.

10 Claims, 13 Drawing Sheets

$^{31}P$ 40KeV 5E15cm$^{-2}$ + $^{19}F$ 35KeV 2E15cm$^{-2}$
700°C 180min

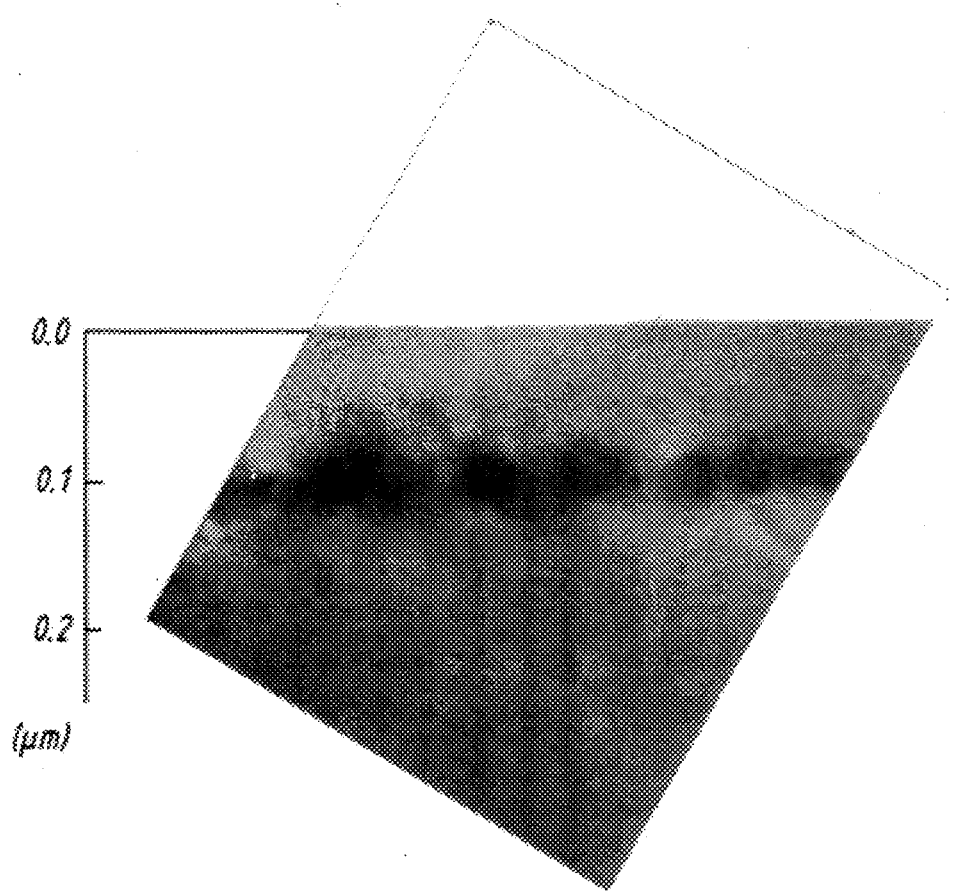

METHOD OF MAKING N-TYPE SEMICONDUCTOR REGION BY IMPLANTATION

This is a continuation of application Ser. No. 08/203,497, filed on Feb. 28, 1994, which is a continuation of application Ser. No. 07/819,775, filed on Jan. 13, 1992, which is itself a division of application Ser. No. 07/700,890, filed May 10, 1991, which is a continuation of application Ser. No. 07/379,439, filed Jul. 12, 1989, all now abandoned.

BACKGROUND OF THE INVENTION

1. Field of the Invention

The present invention concerns a semiconductor device and a manufacturing method therefor and, particularly, it relates to a semiconductor device and a method of manufacturing the semiconductor device which is effective for bipolar transistors, MISFETs, (Insulated Gate Type Field Effect Transistors) and LSI (Large Scaled Semiconductor Integrated Circuit Devices). The present invention also relates to a semiconductor device having a TFT (Thin Film Transistor) or a high resistance element.

2. Description of the Prior Art

In the technology for semiconductor integrated circuit devices (IC), particularly, BiCMOS (Bipolar Complementary Metal Oxide Semiconductor) integrated circuits, it has been the general practice to form a P-type well, or trench, region on an N-type semiconductor substrate and to form an N-channel type MISFET in the P-well region.

A technique for forming a bipolar transistor instead of a CMOS inverter with low driving power, thereby constituting a power transistor in the final stage of an output section, etc., by utilizing the P-type well region is described in, for example, Japanese Patent Laid-Open Publication Sho 57-130461.

That is, in the CMOS integrated circuit, a P-type diffusion region as a base region is formed at the same time as the production step for the P-type well region on an N-type semiconductor substrate and an N$^+$ region as an emitter region is formed at the same time as the formation of source and drain regions on the P-type diffusion region. It serves to provide an NPN-type bipolar transistor on the CMOS integrated circuit without altering the process at all.

Further, Japanese Patent Laid-Open Publication Sho 58-207671 discloses a semiconductor device having a base diffusion layer on one main surface of a semiconductor substrate and an emitter diffusion region formed in a portion of the surface thereof, in which a portion serving as an emitter diffusion mask formed on the base-emitter junction surface comprises a thin semiconductor oxide film and a polycrystalline semiconductor film formed thereon and the portion itself constitutes a peripheral portion of the emitter contact.

Furthermore, Japanese Patent Laid-Open Publication Sho 60-38856 discloses a method of manufacturing a semiconductor device in which an insulated gate electrode is formed with a polysilicon or metal silicide layer, a source and drain diffusion layer is formed by using the gate electrode and a field oxide film as a mask, and contacts and electrodes for each transistor are formed with a second polysilicon layer by way of an insulation film on the gate electrode, wherein a base diffusion layer as a base region is formed previously at an appropriate position of the substrate, a portion of the insulation film on the base diffusion layer is removed simultaneously with the formation of a contact hole for disposing source and drain electrodes made of polysilicon and, thereafter, a second polysilicon layer is deposited and an emitter diffusion layer is formed by thermal diffusion of impurity doped in the second polysilicon layer.

In each of the semiconductor devices described above, the N-type diffusion layer has been formed by implanting ions of a single impurity element belonging to group V of the Periodical Table, for example As (arsenic), P (phosphorus), or Sb (antimony). Further, an element belonging to the group V, for example P or As, has been introduced into the N-type diffusion layer in silicon. However, if the group V element is present at a high concentration, secondary defects are present in the high concentration region after heat treatment. For example, in the case of implanting As at $4 \times 10^{15}$ cm$^{-2}$ in a silicon substrate, followed by annealing, secondary defects are present in the region at the boundary between single crystals and amorphous material (a–C) and a region in which As is present at a concentration higher than $5 \times 10^{20}$ cm$^{-3}$ upon implantation. Further, for the As redistribution, As at high concentration causes accelerated diffusion to result in increased As redistribution. Accordingly, the secondary defects impair the reliability of the semiconductor device and the As redistribution hinders miniaturization and increase in the integration degree of the semiconductor device. The secondary defects and the redistribution are also present for other group V elements, that is, P and Sb.

Further, for a MISFET in an IC using, for example, a silicon substrate, a gate insulation film comprising a silicon oxide film is formed by thermally oxidizing the silicon substrate, and a gate electrode composed, for example, of polycrystalline silicon is formed on the gate insulation film. However, the boundary between the substrate and the gate insulation film, between the substrate and the element isolating insulation film, or between the gate insulation film and the gate electrode is not stable, which renders the electric characteristics of the MISFET instable during operation of the IC. For instance, there has been a problem of degradation in the threshold value voltage or current gain coefficient. Although the boundary can be stabilized by H$_2$ forming gas sintering, Si—H bond is weak so that degradation in the characteristics of MISFETs has not yet been reduced completely.

Furthermore, TFTs used for liquid crystal television sets or TFTs and high resistance elements used for LSIs such as SRAMs use a thin film of polycrystalline silicon or amorphous silicon merely introduced with an impurity of a group III or V element.

Further, silicide layers of metal, for example Ti (titanium), Mo (molybdenum), W (tungsten), Ta (tantalum), Pt (platinum), Pd (palladium), Zr (zirconium), etc., are used as a portion of the gate electrode or the source and drain region. However, the diffusion of a group V impurity (P or As) in the silicide layer is extremely fast and it is impossible to dope the group V impurity selectively, for example, only in the N-type region by heat treatment through the silicide during manufacture of LSI. For instance, in a gate electrode comprising a dual lamination layer of polycrystalline silicon and metal silicide (polycide), group V element ions (As) selectively implanted into an N-type MISFET region are diffused into the metal silicide by the subsequent heat treatment, and reach as far as a P-type MISFET region, causing As doping also into the polycrystalline silicon of the gate electrode in the P-type region, thereby deteriorating the electric characteristics of the P-type MISFET.

In this way, secondary defects are created in a high concentration region in the diffusion layer comprising a group V impurity at a high concentration.

Further, the group V impurity at high concentration cause accelerated diffusion upon annealing, making it difficult for the formation of a shallow junction. Further, since the group V element causes violent redistribution in polycrystalline Si, refractory metal and refractory metal silicide, miniaturization for contacts or elements is impossible.

Further, upon forming an N-type diffusion layer by ion implantation, since secondary defects are also present at the boundary between amorphous and single crystals upon an implantation, there has been a problem that the performance of the element is deteriorated.

SUMMARY OF THE INVENTION

Objects of the present invention are to provide a semiconductor device comprising at least one N-type diffusion layer, having a shallow N-type diffusion layer free from secondary defects, and a method of manufacturing such a semiconductor device, as well as to attain a high integration degree in a semiconductor device by restricting the redistribution of group V atoms in polycrystalline Si, refractory metal silicide and refractory metal silicide.

Another object of the present invention is to provide a semiconductor device in which a boundary between a gate electrode and a gate insulation layer and a boundary between the gate insulation film and a substrate are stabilized and which is free from the degradation of electric characteristics of MISFETs during operation of ICs.

Further, as the quality for the picture provided by a television set is made higher and the degree of integration is increased in LSIs, miniature circuit devices using polycrystalline silicon or amorphous silicon provide the following two problems:

Firstly, a group V or III impurity doped into the silicon thin film causes a great redistribution to cause short-circuits in the high resistance portion in high resistance elements and short-circuits between the source region and the drain region in TFTs. Accordingly, miniaturization of the device has been difficult.

Secondly, the boundary between the gate insulation film and the thin silicon film of a TFT is not stable due to silicon dangling bonds, which bring about problems in that the reliability that the electric characteristics such as ON current or threshold voltage during operation is deteriorated, and resistivity fluctuations are caused in the high resistance region.

Accordingly, a further object of the present invention is to provide a semiconductor device in which miniaturized and high reliability thin film polycrystalline silicon or amorphous silicon components are formed.

A still further object of the present invention is to overcome the foregoing drawbacks in the prior art and provide a semiconductor device in which the diffusion of group V impurity in refractory metal silicide is suppressed and disadvantages in CMISLSI caused by the redistribution of a group V element through the refractory metal silicide is avoided.

The present invention provides a semiconductor device comprising at least one layer containing an element impurity such as a group V impurity, an impurity of high electronegativity or a halogen element impurity, for example, F, Cl, O, Br, Si, I and N in amorphous, polycrystalline or single crystal silicon, a refractory metal such as Ti, Mo, W, Ta, Pt, Pd and Zr or a silicide of such refractory metals, in which the profile of the impurity of high electronegativity or halogen element impurity is shallower and the concentration is lower than that of the group V impurity.

The present invention further provides a method of manufacturing a semiconductor device which comprises introducing ions of group V impurity in amorphous, polycrystalline or single crystal silicon, refractory metal or silicide of such refractory metal, wherein ions of an element of high electronegativity or ions of a halogen element, for example, F, O, Cl Br, S, I or N are introduced, with annealing before, after or during ion introduction.

The present invention further provides a method of manufacturing a semiconductor device in which the profile upon introducing the impurity of high electronegativity or impurity of halogen element is distributed more deeply then the amorphous layer formed upon introducing ions of a group V impurity.

It is considered in the present invention that since the elements of a group V impurity (Sb, As, P, etc.) and an impurity element of high electronegativity or impurity of a halogen element (F, O, Cl, Br, S, I, N) form covalent bonds or ionic bonds, etc., in amorphous, polycrystalline, or single crystal silicon, refractory metal or silicide of such metal to avoid trapping of interstitial silicon with an element of a group V impurity, accelerated diffusion caused by interstitial silicon or interstitial silicon type secondary defects is suppressed.

Further, since the diffusion of an element such as F, O, Cl, Br, S, I or N is faster than that of a group V element, these atoms can be present at stable positions, i.e., only in the inside of the profile of the group V element by annealing. Further, the redistribution of group V elements in connectors can be suppressed by incorporating the impurity of high electronegativity in polycrystalline Si, refractory metal or silicide of refractory metal.

Further, a feature of the present invention resides in that F atoms, etc., are present at the boundary between the gate insulation film and the substrate or at the boundary between the gate electrode and the gate insulation film. Since F bonds with Si to form a strong Si—F bond, no dangling bonds are present at the boundary between $SiO_2$ and Si to obtain a stable boundary.

A further feature of the present invention resides in that the redistribution of the group V element in the refractory metal silicide is suppressed by incorporating an impurity of high electronegativity, for example, F, O, Cl, Br, S, I, N in the refractory metal silicide. Although the mechanism has not yet been apparent at present, it is considered that, for instance, diffusion of As in $TiSi_2$ causes redistribution by way of the dangling bonds of silicon present at the grain boundary of $TiSi_2$. On the other hand, if F of high electronegativity, for example, is incorporated into $TiSi_2$, since the silicon dangling bonds at the grain boundary have a large Si—F bonding energy, they bond with F to eliminate the As diffusing activity and to suppress the As redistribution.

BRIEF DESCRIPTION OF THE DRAWINGS

These and other objects, as well as advantageous features of the present invention will become apparent by reading the following descriptions of preferred embodiments according to the present invention in conjunction with the accompanying drawings, wherein.

DESCRIPTION OF THE PREFERRED EMBODIMENTS

EXAMPLES

Example 1

Figure 1:
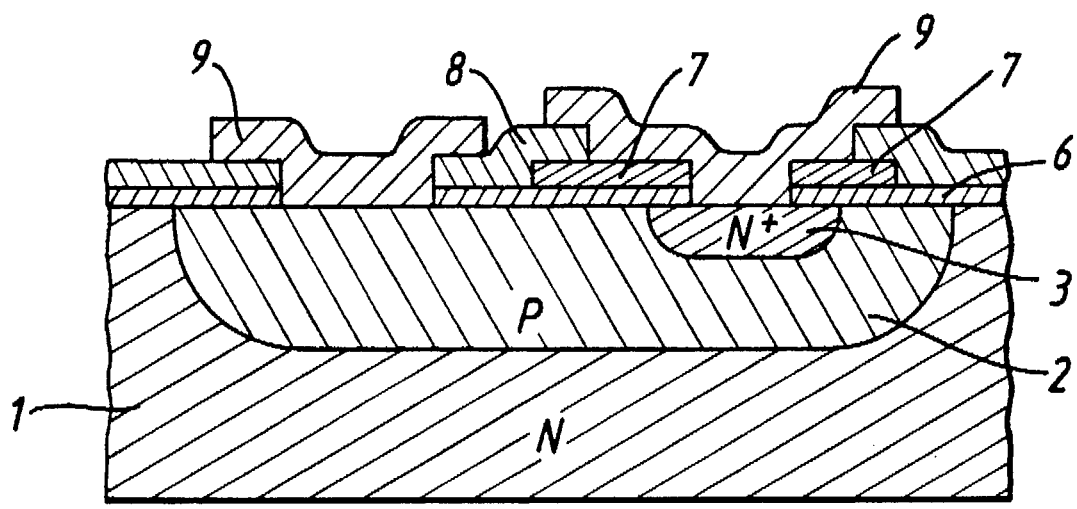
FIG. 1 is a longitudinal cross-sectional view illustrating a basic structure of a bipolar element according to the present invention.

FIG. 1 shows in longitudinal cross section the basic structure of a bipolar device according to the present invention and FIGS. 2(a)–2(i) show in cross section the steps in the example for manufacturing a bipolar CMISIC according to the present invention containing the transistor of FIG. 1.

In FIG. 1 an N-type semiconductor substrate 1 serves as a collector, a P-type diffusion layer 2 serves as a base, and an N$^+$-type diffusion region 3 serves as an emitter of a bipolar transistor. The device further includes thin oxide film (gate oxide film) 6, polycrystalline semiconductor film (polysilicon film) 7, PSG (phosphorus silicate glass) film 8, and Al electrodes 9 constituting base and emitter electrodes. The structures shown in FIGS. 2 include P$^-$-type silicon substrate 10, N$^+$-type embedded layer 11, isolation P-type layer 12, N-type epitaxial layer 13, element isolation oxide film 14, P-type well 15, mask 16, base region 17, thin oxide films 18a, 18b, polysilicon films 19a, 19b, mask 20, N$^+$-type emitter 21, polysilicon gate 22, mask 23, P$^+$-type source and drain 24, P$^+$-type base contact 25, mask 26, N$^+$-type source and drain 27, PSG film 28, Al electrode (wiring) 29, and N$^+$-type collector contact portion 30.

As shown in FIG. 1, the N$^+$-type diffusion region 3 is constituted by forming an N$^+$-type diffusion layer comprising an impurity element belonging to group V such as As or P and an impurity of high electronegativity, for example, F, Cl, O, Br, S, I or N.

Then, the steps for manufacturing the semiconductor device according to the present invention are performed in the order shown in FIGS. 2(a)–2(i).

FIG. 2(a)

At first, N$^+$-type embedded layer regions 11 are embedded in one main surface of the P$^-$-type silicon substrate (wafer) 10 and the N-type epitaxial layer regions 13 isolated from one another by isolation P-type layer regions 12 and the element isolating oxide insulation film regions 14 are epitaxially grown to a specific resistivity of about 1 ohm and a thickness of 3 to 10 μm.

In this case, if the N$^+$-type embedded layer 11 is constituted by a group V element and an element of high electronegativity or halogen element such as As and F, Sb and F, etc., a satisfactory substrate can be obtained with no defects in the epitaxially grown silicon layer 13 and with no redistribution in the N$^+$-type embedded layer 11.

Figure 8:
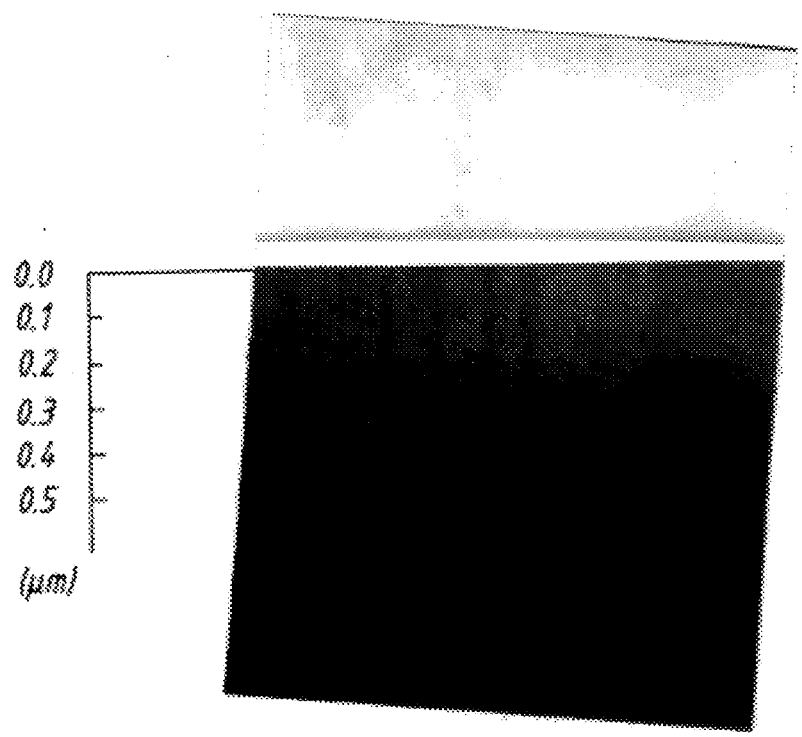
FIGS. 8(a) and 8(b) are, respectively, explanatory photographs illustrating the state of crystals upon introducing As impurity in an example of the present invention and in the prior art.
Figure 8:
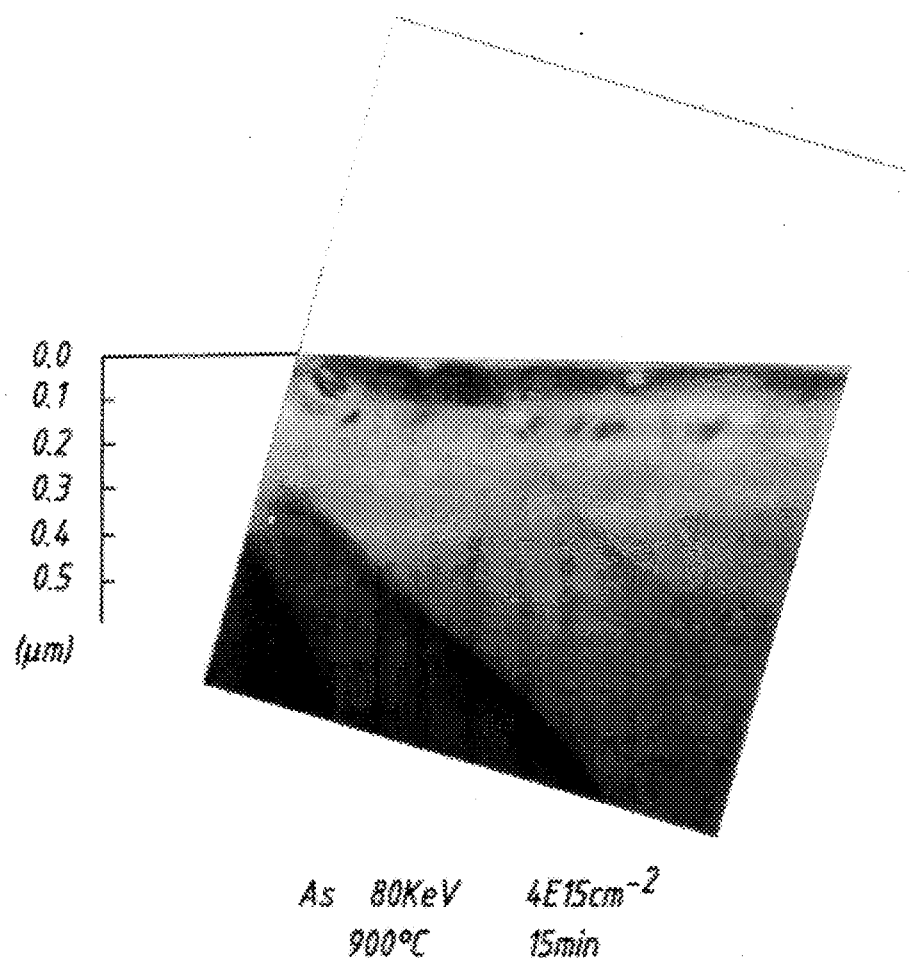

FIGS. 8(a) and 8(b) show the result of TEM observation for the cross section of a sample (FIG. 8b) prepared by implanting As at 4 E 15 cm$^{-2}$, 80 KeV and a sample (FIG. 8(a)) prepared by additionally implanting F at 35 KeV, 2 E 15 cm$^{-2}$ after implanting As at 4 E 15 cm$^{-2}$, 80 KeV and after performing N$_2$ annealing at 800° C. for 15 minutes. FIG. 8(a) shows the embodiment of the present invention, and FIG. 8(b) shows the conventional one. Secondary defects are present in the sample implanted only with As, whereas no secondary defects are present in the sample to which F is additionally implanted according to this example. The N$^+$ embedded layer 11 can also be formed by ion implantation at high energy, for example MeV ion implantation of As or P. In this case, if an element of high electronegativity (for example, F) is MeV ion implanted together with group V ions, a diffusion layer 11 with less redistribution and restricted defects can be obtained.

Returning to FIG. 2(a), element isolation oxide layer regions 14 are formed by selectively oxidizing the surface of the N-type epitaxial Si layer 13 at low temperature, which is further isolated into smaller regions.

Figure 2:
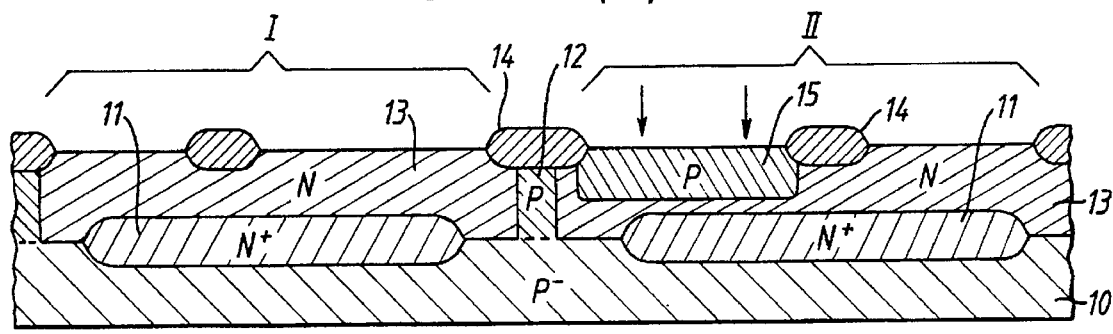
FIGS. 2(a)–2(i) are cross-sectional views illustrating the steps in Example 1 for the method of manufacturing a bipolar MOSIC according to the present invention.
Figure 2:
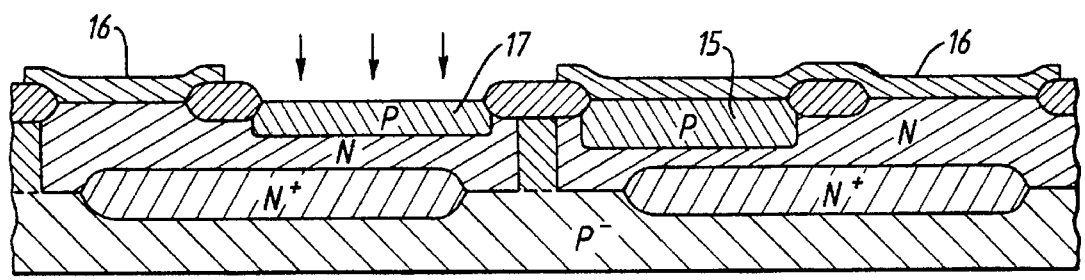
Figure 2:
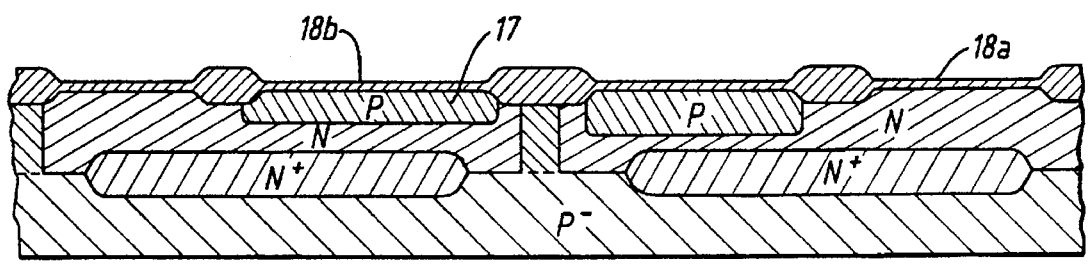
Figure 2:
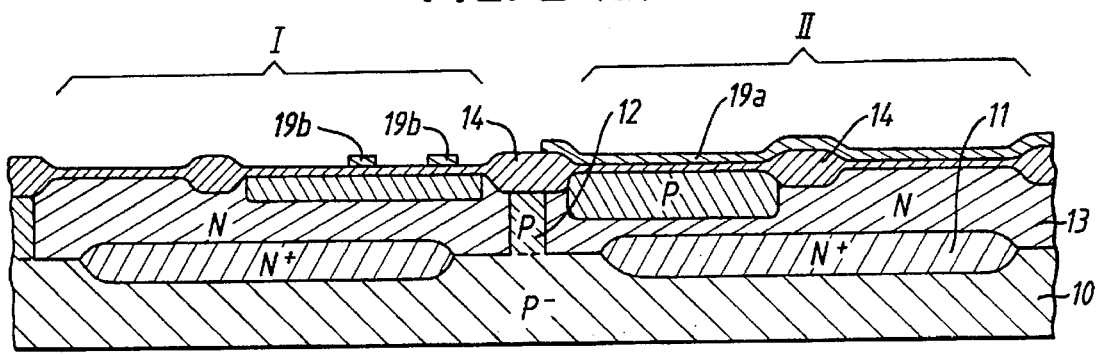
Figure 2:
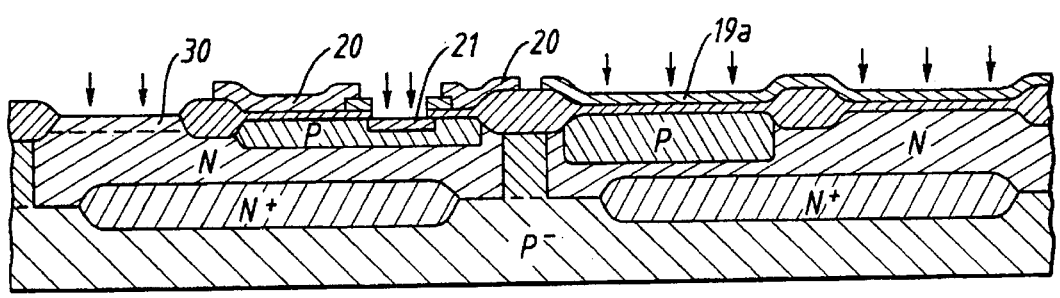
Figure 2:
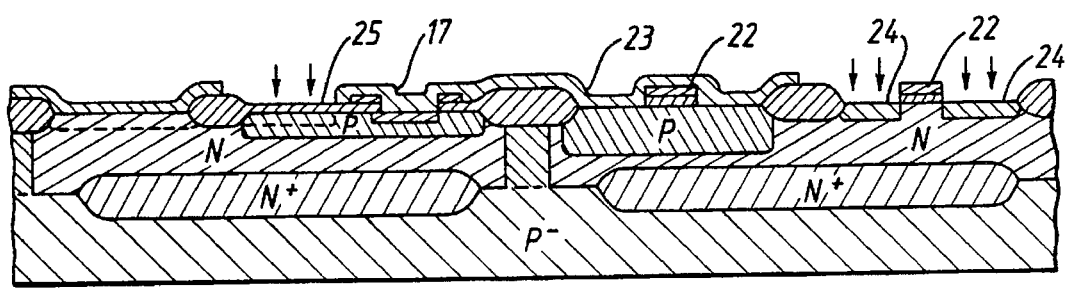
Figure 2:
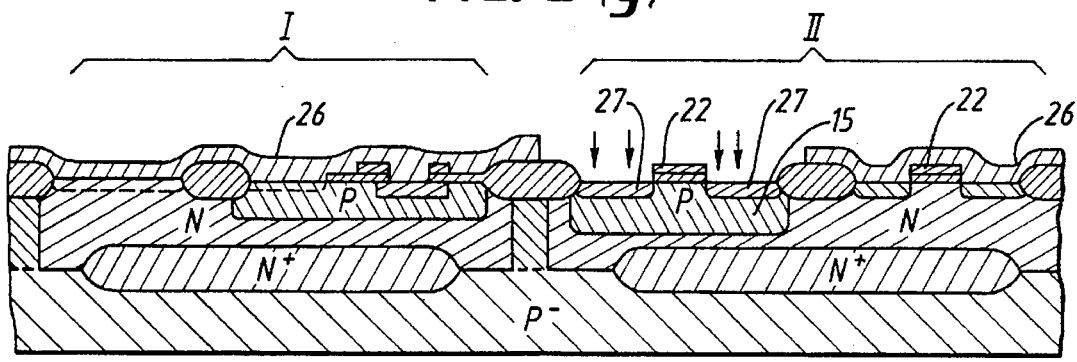
Figure 2:
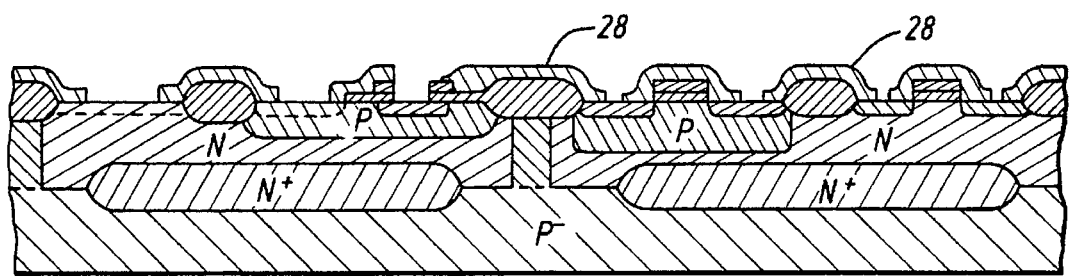
Figure 2:
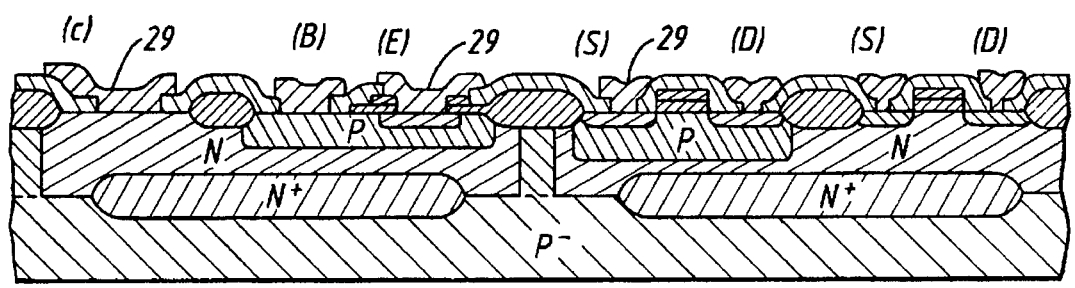

In FIG. 2, I represents a region in which a bipolar element is formed and II represents a region in which an MIS element is formed.

The P-type well 15 is formed to a depth of about 4 μm and is isolated by element isolation oxide layer regions 14 in the region II by selective ion implanting of B (boron) impurity.

FIG. 2(b)

A mask 16 is formed by photoresist processing, and the P-type region 17 as the base is formed to a depth of 1.5 μm by disposition diffusion of B at the surface of the N-type layer in a portion of the region (I).

FIG. 2(c)

After removing mask 16 at the surface and the surface oxide film, gate oxidation is performed to form thin thermally oxidized films 18a and 18b over the entire surface. In this case, oxide film 18a of a thickness about 100 Å to 1000 Å is formed on the side of MIS (II) as the gate portion, whereas oxide film 18b is formed to a thickness greater than that on the side of the gate, for example of about 100 Å to 1300 Å, by accelerated oxidation with B to the surface of the P-type region 17 as the base.

FIG. 2(d)

Silicon formed from a gas phase is deposited on the entire surface to form polysilicon films 19a and 19b.

Then, the polysilicon layer on the side of the bipolar (I) is removed by photoresist processing, in which the polysilicon film 19b is left only at the peripheral portion of the emitter.

FIG. 2(e)

After ion implanting, an impurity such as As (arsenic) at about 4×10$^{15}$ cm$^{-2}$ in a region defined by mask 20 formed by a photoresist processing on the surface of the P-type base region 17 and having an opening for forming emitter region 21, an element of high electronegativity, that is, F, Cl, O, Br, S, I or N, for example F at 2×10$^{15}$ cm$^{-2}$, is ion implanted and diffused, followed by annealing at 900° C. for 15 minutes to form the N⁺-type emitter region 21 and the N⁺-type collector contact portion 30.

By setting the As implantation energy to 80 KeV and the F implantation energy to 35 KeV, the F distribution upon injection is present to a region deeper than the a–c boundary upon implantation. No secondary defects are present in the As injection layer according to this embodiment as shown in FIG. 8(a).

Figure 9:
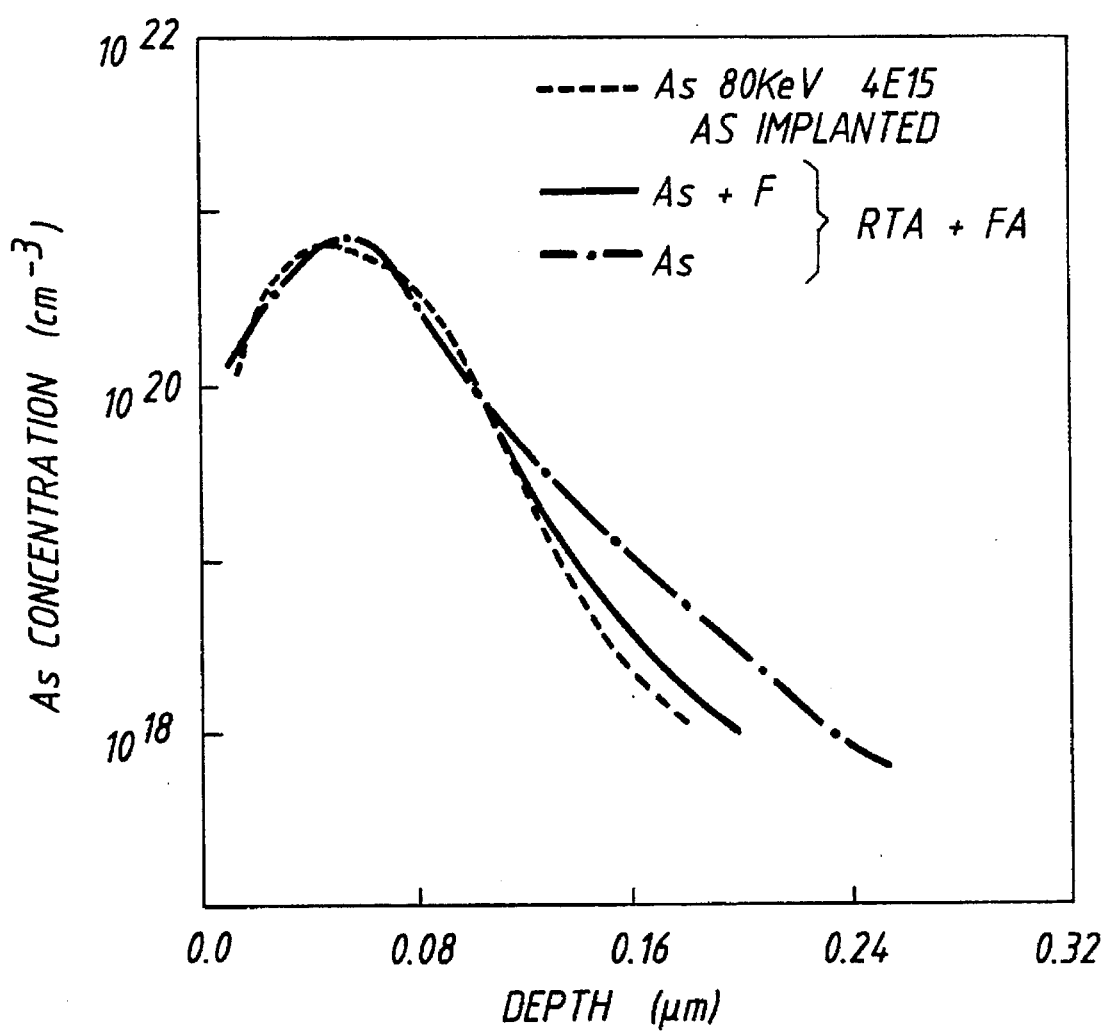
FIG. 9 is a graph illustrating relationships between the concentration and the depth of As impurity in an example of the present invention and in the prior art.

Further, As redistribution can also be restricted as shown in FIG. 9, which illustrates the As profile in the case of applying rapid thermal annealing (RTA) at 1020° C. and, thereafter, furnace annealing (FA) at 650° C. compared with a sample prepared only by implanting AS at 80 KeV, 4 E 15 cm⁻² and an As and F implantation sample according to this embodiment, the latter being annealed as described in connection with the annealed As sample. The additional F implantation sample according to this embodiment allows the formation of a junction with less As redistribution and a shallow depth.

Further, after heat treatment at 900° C. for 15 minutes, F is distributed only to the inside of the As profile.

In this case, N-type impurity at high concentration is diffused into the polysilicon film 19a on the side of MIS (II) simultaneously to lower the resistance. Further, in a case of selectively forming a polycrystalline silicon connector layer having high resistivity, which is effective in the high resistance wiring layer used for SRAMs, etc., if As and F are implanted into the diffusion layer region of the polycrystalline silicon, As can be suppressed from diffusion in the polycrystalline silicon in the lateral direction (in the direction of the plane), thereby aiding further miniaturization of the high resistance wiring. Further, in a case where films 19a and 19b constitute grate electrodes containing silicide or refractory metal, for example, a polycide structure, the later redistributribution of a group V impurity in the polycide wiring layer is restricted by the presence of an impurity of high electronegativity in this embodiment. Accordingly, there is no disadvantage due to the redistribution of the group V element in the silicide.

The deposition of the N-type impurity may be applied just after the formation of the polysilicon film in the step of FIG. 2(d).

FIG. 2(f)

Gate photoetching is performed on the polysilicon film on the side MIS (II) to expose the surface of the semiconductor in the source and drain portions and, at the same time, to form the polysilicon gate 22.

Then, B (boron) impurity is deposited or ion implanted or diffused in a state where the mask material 23 is formed on a portion of the surface, to form the P⁺-type regions 24 as the source and drain to a depth of 0.1 to 0.8 µm self-aligned with the gate at the surface of the N-type layer in the region II.

On the other hand, the P⁺-type layer 25 at high concentration for the base contact is formed also on the base surface in the region (I) on the bipolar side.

FIG. 2(g)

Only the portion above the P-type well 15 of the MIS side (region (II)) is exposed while covering other portions with the mask 26 and As is ion implanted in the same manner as in the step of FIG. 2(e). Then, F is implanted and diffused, followed by annealing, thereby forming the N⁺-type regions 27 as the source and drain self-aligned with the gate to a depth of 0.05 to 0.8 µm at the P-type well surface.

In this case, if P and F are implanted, shallow junctions with less secondary defects and less redistribution can be formed.

Figure 10:
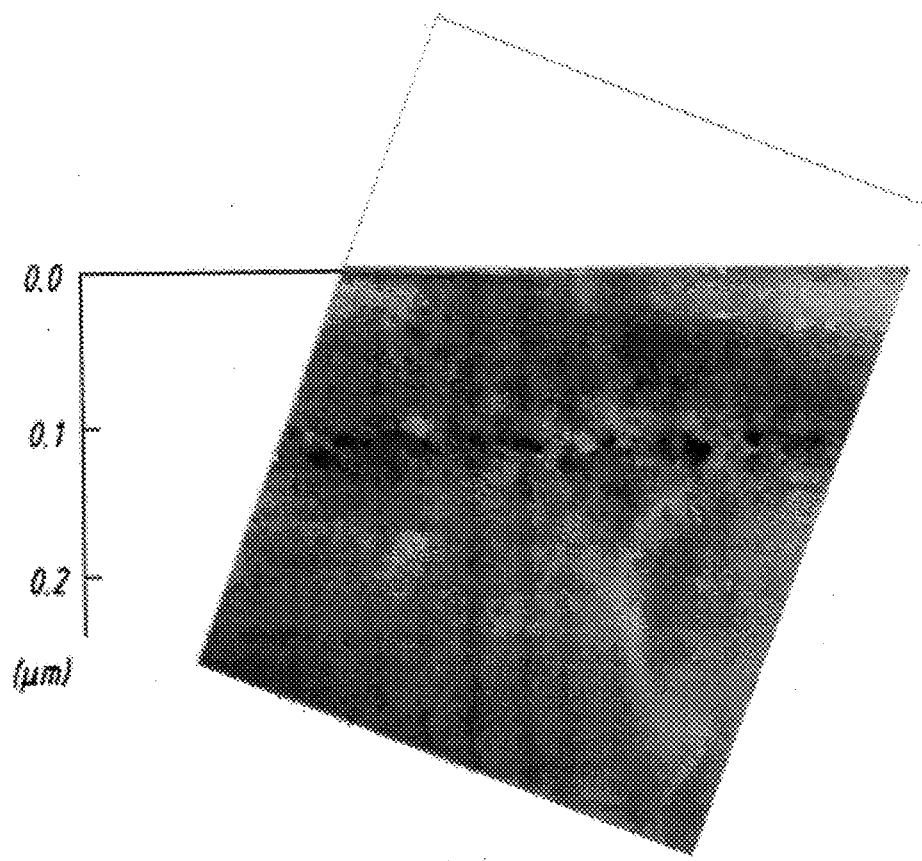
FIGS. 10(a) and 10(b) are, respectively, explanatory photographs illustrating the state of crystals upon introducing P impurity in an example of the present invention and in the prior art.
Figure 11:
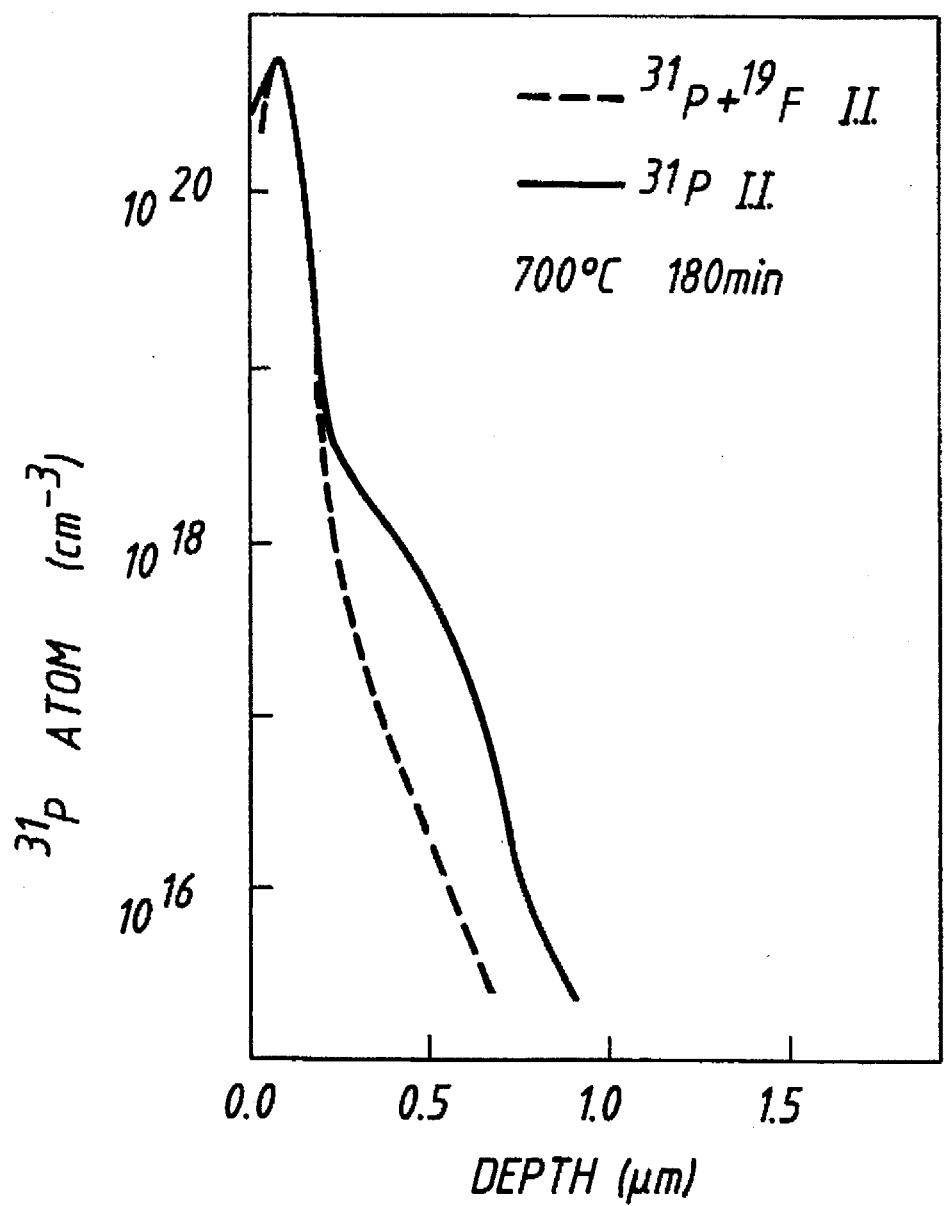
FIG. 11 is a graph illustrating relationships between the concentration and the depth of P impurity in an example of the present invention and in the prior art.

FIGS. 10(a), 10(b) and 11 show the P profile and the cross sectional TEM image after $N_2$ annealing at 700° C. for 180 minutes, for a sample (FIG. 10(b)) prepared by implanting $^{31}$P at 40 KeV, 5 E 15 cm⁻² and a sample (FIG. 10(a)) prepared by implanting $^{31}$P at 40 KeV, 5E 15 cm⁻² and, thereafter, implanting $^{19}$F at 35 KeV, 2E 15 cm⁻². The sample of FIG. 10(a), being implanted with $^{31}$P and $^{19}$F in this embodiment, growing of the secondary defects is suppressed and the P-distribution of the P tail is small. Relative to this, in the sample of FIG. 10(b), growing of secondary defects is found. Accordingly, in the sample of FIG. 10(a), a shallow junction with restricted defects is formed.

FIG. 2(h)

After depositing the PSG (phosphorus silicate glass) film 28 over the entire surface, contact photoetching is applied to remove selected portions of that film.

FIG. 2(i)

Al is vapor deposited (or sputtered) and pattern-etched to form the electrodes, or wiring, 29 in ohmic-contact with each of the regions.

By the process as described above, Bi-CMISIC including an NPN transistor having an emitter of small size and a short channel MISFET is completed.

Although the explanation has been made for the present invention in a case applied to Bi-CMISIC including an NPN transistor and a short channel MISFET, the present invention is not restricted only to this example, but is applicable to any semiconductor device so long as it comprises an N-type diffusion layer or a wiring layer of polycrystalline silicon, metal and metal silicide containing a group V element.

Silicon is not restricted only to polysilicon and single crystal silicon but it may be amorphous silicon. Further, the characteristics shown in FIGS. 8 through 11 are similar in other Examples 2 through 5, to be described below.

In this example, a group V impurity is introduced at high concentration at an energy of 40 KeV and 80 KeV. However, when the concentration is low, the same effects as that in this example can also be obtained by increasing the introduced energy to higher than 100 KeV, thereby increasing the interstitial silicon.

In conventional semiconductor devices, a diffusion layer containing a group V impurity at high concentration is formed upon forming the N-type diffusion layer by implanting ions of a single group V impurity, for example As or P, but since there is a great redistribution of the group V element impurity due to accelerated diffusion, it has been difficult to form a shallow junction. Further, since the redistribution of the group V element impurity is also great in the wiring of polycrystalline silicon and polycide, it has heretofore been difficult to reduce the size of the wiring.

Further, in a case where the secondary defects are created in the high concentration region and the secondary defects are present also at the original boundary region between the amorphous and the single crystals upon implantation, forming the N-type diffusion layer by ion implantation leads to a problem that the device performance is reduced. However, the semiconductor device according to the present invention can comprise an N-type diffusion layer free from secondary defects and having a shallow junction. Further, since the redistribution of the group V impurity is suppressed in the polycrystalline silicon, metal and silicide wiring in this example, it can enhance the miniaturization and high integration degree for the high resistivity polycrystalline silicon device or polycide gate electrode shown in other examples.

Example 2

In this example, As as the group V element which has most generally been used for the N-type diffusion layer is to be explained but the situation is similar also with P or Sb element from a theoretical point of view. Further, although explanation is made with respect to F, of the highest electronegativity, in this example, similar effects can also be obtained for other elements of high electronegativity such as Cl, O, N, Br, I or S although the degree of the effect is somewhat reduced.

After implanting As at a high concentration in a silicon (100) substrate, F is implanted at such an energy as to substantially overlap the As implantation profile. F may be implanted before As implantation.

Figure 3:
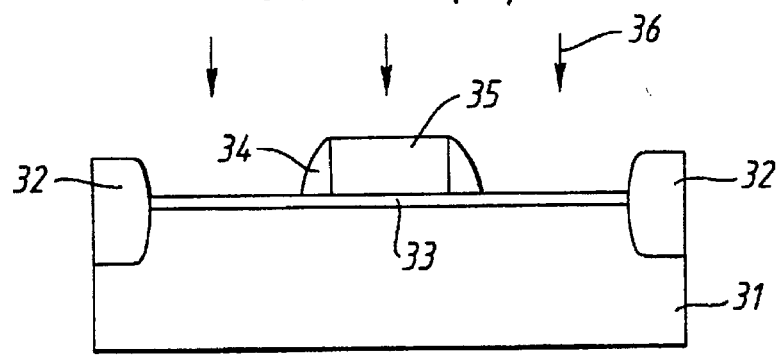
FIGS. 3(a) and 3(c) are cross-sectional views illustrating the steps in Example 2 for the method of manufacturing a semiconductor device according to the present invention.
Figure 3:
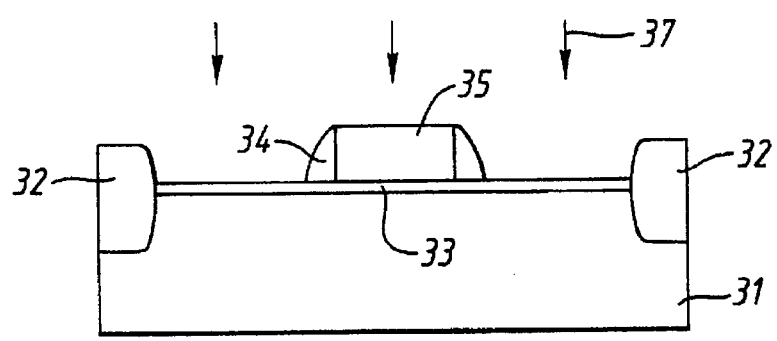
Figure 3:
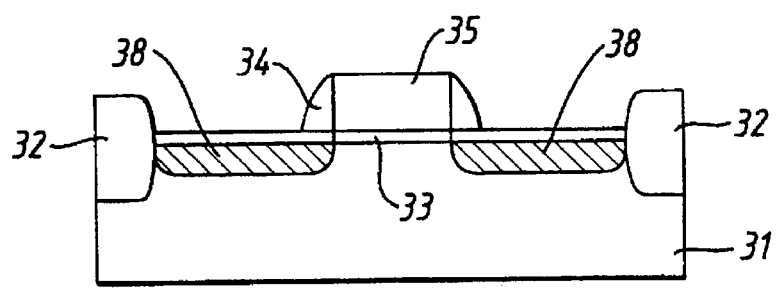

FIGS. 3(a)–3(c) are cross-sectional views illustrating successive steps in a procedure for forming the source and drain regions of a MISFET. A MISFET comprising a gate electrode 35, a gate insulation film 33, a side wall insulation film 34 and source and drain regions 38 isolated by an element isolation insulation film 32 such as of $SiO_2$ is shown on a silicon substrate 31 in FIG. 3(c). In source and drain regions 38, As 36 is implanted selectively at high dose energy (for example, 80 KeV, $4 \times 10^{15}$ cm$^{-2}$) in FIG. 3(a). Then, after selectively implanting F (fluorine) 37 (for example, at 35 KeV, $2 \times 10^{15}$ cm$^{-2}$) in the identical regions selectively, heat treatment is performed (for example, at 900° C. for 15 minutes in $N_2$ atmosphere) as shown in FIG. 3(b). Thus, the source and drain regions 38 are formed. Accordingly, FIG. 3(c) shows a MISFET having an N-type diffusion layer comprising two impurities, that is, As and F at high concentration in the source and drain region 38.

In this case, similar effects can also be obtained by using another element impurity of high electronegativity such as Cl, B, O, Br, S, I and N instead of F, although to a somewhat reduced extent.

In the manufacturing method according to the present invention, since F can restrict the accelerated diffusion of As at high concentration and occurrence of the secondary defects, the N-type diffusion regions 38 free from the secondary defects and with less As redistribution can be obtained. Accordingly, miniaturization of MISFETs is possible to provide an LSI semiconductor device of high reliability and high integration degree.

Example 3

Figure 4:
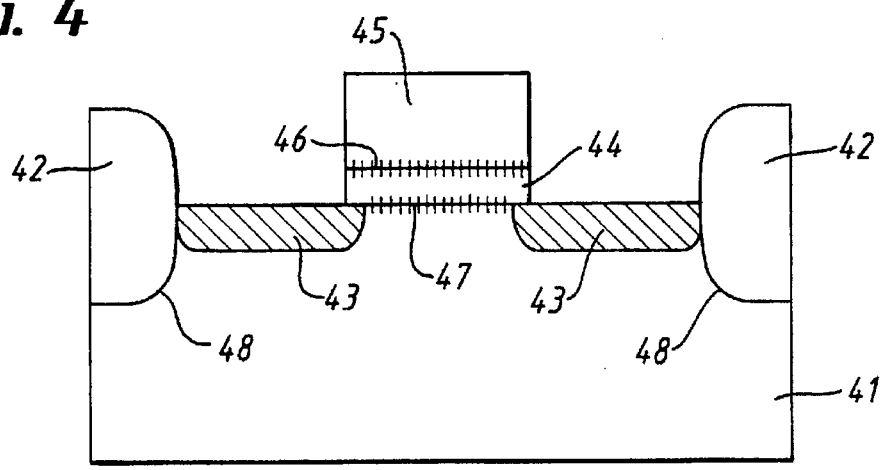
FIG. 4 is a cross-sectional view illustrating a principal portion in Example 3 for the structure of a semiconductor device according to the present invention.

FIG. 4 shows a cross-sectional view of Example 3 of a semiconductor device according to the present invention. An MISFET isolated with an element isolation insulation film 42 is formed on a silicon substrate 41. The MISFET comprises source and drain regions 43, a gate insulation film 44 and a gate electrode 45. F atoms are present near the boundary 47 between the gate insulation film 44 and the silicon substrate 41 or at the interface 48 between the element isolation insulation film 42 and the silicon substrate 41. This can be attained by annealing in an F-containing atmosphere or implanting F-containing ions after forming the gate insulation film 44. F atoms are present also near the boundary 46 between the gate electrode 45 and the gate insulation film 44. The F atoms are particularly effective when the gate electrode is made of polycide or polysilicon. F in the region 46 can be introduced by annealing in an F-containing atmosphere or by implanting F-containing ions after forming the gate electrode 45. Further, when F is introduced after forming the gate electrode 45 and applying high temperature annealing to the source and drain regions 43, the Si—F bonds are stable in the heat treatment of the subsequent step.

Further, F can also be introduced into the boundary 46, 47 or 48 by implanting the F atoms, for example, by MeV ion implantation after forming a wiring layer for connecting the MISFET.

In addition to the F atoms, an impurity of high electronegativity like that of F atoms or halogen atom impurity, for example, Cl, O, Br, S, I or N can be used in the same manner.

According to the present invention, the F atoms are present at the boundary 46 between the gate electrode 45 and the gate insulation film 44, at the boundary 47 between the gate insulation film 44 and the silicon substrate 41 or a boundary 48 between the element isolation insulation film 42 and silicon substrate 41. These boundaries are stable due to the strong Si—F bonds and are free of dangling bonds. Accordingly, electric characteristics of the MISFET do not change during operation of the IC and a semiconductor device of high reliability can be provided.

Example 4

Figure 5:
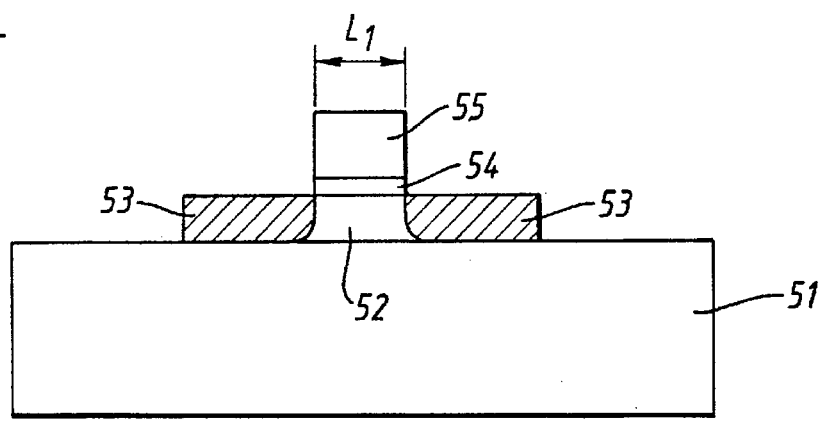
FIGS. 5 and 6 are, respectively, cross-sectional views illustrating a principal portion in Example 4 for the structure of the semiconductor device according to the present invention.

FIG. 5, a cross-sectional view for a TFT according to Example 4. The Figure shows an MISFET comprising a glass or quartz substrate 51 and an amorphous silicon or polycrystalline silicon thin film 52 formed thereon, and having a gate electrode 55, a gate insulation film 54 and source and drain regions 53. F atoms are contained in the amorphous silicon or polycrystalline silicon film 52 of the source and drain regions 53 or channel region by means of F ion implantation or annealing in an F-containing atmosphere. As has been described above, since the F atoms restrict the redistribution of impurity, for example P or As, in the source and drain regions 53, no short-circuit is caused even if the channel length $L_1$ is reduced. Further, F also stabilizes the boundary between the gate insulation film 54 and the silicon thin film 52.

Figure 6:
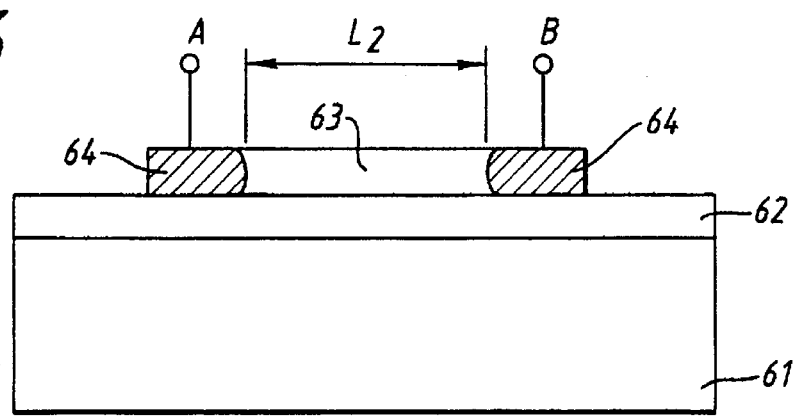

FIG. 6 is a cross-sectional view of a high resistance silicon used in an SRAM according to Example 4. An interlayer insulation film 62 is formed on a silicon substrate 61 and a polycrystalline silicon thin film 63 is formed on the interlayer insulation film 62, which is connected with leads, or wirings, A and B through impurity doping regions 64 made of a group V (P, As, etc.) or a group III (B, etc.) element. The resistivity is determined by the region not doped with the impurity, that is, by the length $L_2$. In this example, F atoms are contained in the high resistance region 63 or the impurity doping regions 64 by F ion implantation or annealing in an F-containing atmosphere. Heretofore, if the length $L_2$ was reduced to less than 2 μm, short-circuits have been caused due to the redistribution of the impurity of P, As or B, etc., upon heat treatment in the subsequent Step. That is, the impurity is diffused also into a region which is to be a resistor, which no longer functions as such. However, the redistribution of the impurity such as B or P, As, etc., is restricted by the introduction of F and no short circuit is caused if the length $L_2$ is reduced into the submicron range, thereby enabling to obtain a stable high resistance region.

In addition to the F atoms, an impurity of high electronegativity like F atoms or halogen element impurity, for example Cl, O, Br, S, I or N, can be used in the same manner.

As has been described above according to this example, it is possible to prepare a TFT element or a high resistance element comprising a thin film of polycrystalline or amorphous silicon of submicron size and a miniaturized and highly reliable semiconductor device can be provided.

Example 5

Figure 7:
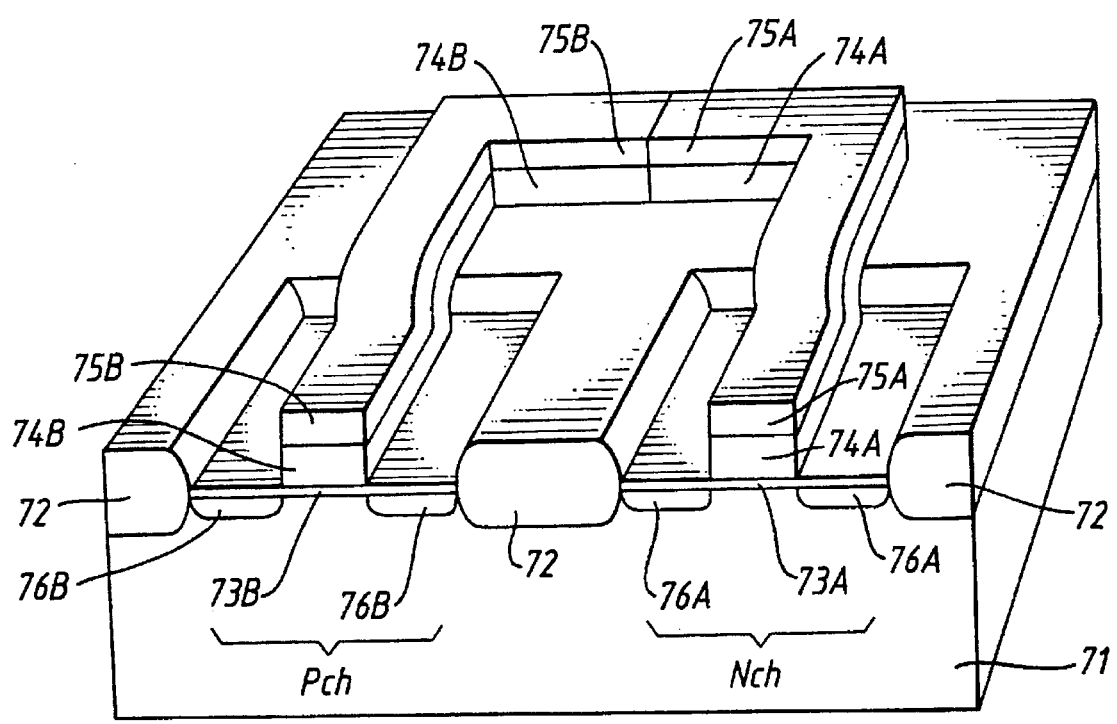
FIG. 7 is a cross-sectional view illustrating a principal portion in Example 5 for the structure of a semiconductor device according to the present invention.

FIG. 7 is a cross-sectional view for a CMISFET semiconductor device according to Example 5. On a silicon substrate 71, a P-type MISFET (Pch=P channel transistor) and an N-type MISFET (Nch=N channel transistor) are formed being isolated by an element isolation insulation film 72 made of $SiO_2$, etc. Then, respective FETs are connected with polycide gate electrodes composed of polycrystalline silicon (74A, 74B) and $TiSi_2$ (75A, 75B). The N-type MISFET comprises a gate insulation film 73A, polycide electrodes (74A, 75A) and source and drain regions 76A. The P-type MISFET comprises a gate insulation film 73B, polycide electrodes (74B, 75B) and source and drain regions 76B. The gate electrodes 74A and 75A of the N-type MISFET contain a group V element, for example, P or As at high concentration. On the other hand, the P-type MISFET contains a group III element, for example B, in the gate electrodes 74B and 75B.

Heretofore, P or As contained in 74A, 75A was diffused in the subsequent heat treatment step to $TiSi_2$ electrode 75B and, further, discharged to the polycrystalline silicon electrode 74B, by which the threshold voltage of the P-type MISFET was shifted and electrical characteristics were not stabilized.

On the other hand, in this example of the invention, since F is implanted into $TiSi_2$ electrode 75A, redistribution of P or As in 74A and 75A is restricted and not diffused to 75B, so that P or As is not present in 74B or 75B. Accordingly, the electrode of the P-type MISFET is constituted with polycrystalline silicon 74B at a predetermined carrier concentration, and the P-type MISFET has electrical characteristics with less fluctuation.

The situation is similar also for other refractory metal silicides, for example, silicides of Mo, W, Ta, Pt, Pd or Zr which may also be used.

Further, the situation is similar for refractory metal per se instead of high melting metal silicide. In addition, an element impurity of high electronegativity such as Cl, O, Br, S, I and N, in addition to F can also be used to obtain similar effect although to a different extent.

As has been described above according to this example, the redistribution of the group V impurity in the high melting metal silicide is restricted, thereby enabling the production of a semiconductor device capable of avoiding the disadvantage in CMILSI caused by the redistribution of the group V element.

In examples 1–5 above, among the impurities of high electrical negativity or halogen element impurity, F particularly has a remarkable effect as compared with that of Cl, O, Br, S, I, or N.

In conventional semiconductor devices, an N-type diffusion layer comprising a group V impurity at high concentration has been formed by implanting ions of a single group V impurity, for example, As P, etc. However, the redistribution of the group V element impurity due to accelerated diffusion is substantial making it difficult to form a shallow junction. In addition, the redistribution of the group V element impurity is also substantial in the wiring of polycrystalline silicon or polycide, making it difficult to miniaturize the wiring.

Further, since secondary defects are formed in the high concentration region, and the secondary defects are present in the boundary region between amorphous and single crystal upon implantation in addition to the high concentration region when the N-type diffusion layer is formed by ion implantation, there has been a problem that the element performance is reduced. However, in the semiconductor device according to the present invention, it is possible to provide a semiconductor device having an N-type diffusion layer free from the secondary defects and having a shallow junction, as well as a method of manufacturing such a semiconductor. Further, in the present invention, since the redistribution of the group V impurity is restricted in the wiring of polycrystalline silicon, metal and silicide, miniaturization and the degree of high integration can be enhanced for high resistance polycrystalline silicon elements, TFT devices or polycide gate electrodes.

In the practice os the present invention, the dose level for the group V element may be in the range commonly employed for semiconductor devices, which is about $4 \times 10^{15}$ $cm^{-2}$ to about $8 \times 10^{15}$ $cm^{-2}$.

The dose level for the halogen element or the element exhibiting high electronegativity, such as fluorine, is selected on the basis of the following considerations. When the F dose is $2 \times 10^{15}$ $cm^{-2}$, the crystal defect caused by the single group V element disappears. Therefore, it has been found to be possible to eliminate such crystal defects and to obtain the advantageous results described herein as long as the halogen element or the element having high electronegativity is introduced with a sufficient dose, such as $2 \times 10^{15}$ $cm^{-2}$ in the case of fluorine.

Accordingly, the dose of the halogen element or the element having high electronegativity need be substantially equal to that which will prevent appearance of a crystal defect due to introduction of the group V element.

In further accordance with the invention, improved results are achieved if the depth of the concentration peak of the group V element in the substrate is substantially equal to the depth of the concentration peak of the halogen element or the element having high electronegativity. It is believed that the improved result is created for the following reason. When a group V element, such as As, is introduced into a silicon substrate, it traps interstitial silicon, but if the amount of the group V element is increased, redistribution of the group V element occurs and that element and the interstitial silicon are divided, thereby giving rise to crystal defects. These defects are prevented to a greater degree if the concentration peaks of the halogen element or the element having high electronegativity coincides with that of the group V element, where the greatest redistribution of the group V element occurs.

It presently appears that the concentration of the halogen element or the element having a high electronegativity should preferably be between 1% and several multiples of 10% of the concentration of the group V element.

The impurity introduced according to the invention, in addition to the group v impurity, may be of one element having high electronegativity, such as F, O, Cl, N or S, a mixture of these elements, one halogen element, such as F, Cl, Br or I, a mixture of these elements, or a mixture of halogen and high electronegativity elements. The most preferred elements are, in the order stated: F, O, Cl, or N.

This application relates to subject matter disclosed in Japanese Patent Applications Nos. 174107/88, filed Jul. 12, 1988, 177228/88, filed Jul. 18, 1988, 189212/88, filed Jul. 28, 1988, 189211/88, filed Jul. 28, 1988, 174111/88, filed Jul. 12, 1988, and a Japanese application with an unknown number, filed Apr. 21, 1989, the disclosures of which are incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. In a process for manufacturing a semiconductor device in a body which includes a region composed of single crystal silicon, the improvement comprising causing the region to be an N-type conductivity region by the steps of:

introducing into the region a first impurity constituted by an element selected from group V of the Periodic Table;

without annealing the region after introducing the first impurity, introducing into the region a second impurity constituted by a halogen element, O, S, or N in an amount sufficient to prevent secondary defects due to the first impurity from being present in the region; and after said steps of introducing a first impurity and a second impurity, annealing the region, wherein said step of introducing a first impurity causes a layer of the region into which the first impurity is introduced to have an amorphous structure and said step of introducing a second impurity is carried out to give the second impurity a profile which extends into the region to a greater depth than does the layer of amorphous structure.

2. A process for manufacturing a semiconductor device as defined in claim 1 wherein the first impurity is introduced in a first dose and the second impurity is introduced in a second dose which is between one-fourth and one-half the first dose.

3. A process for manufacturing a semiconductor device as defined in claim 1 wherein each of the impurities has a concentration peak at a depth in the region and the depth of the concentration peak of the first impurity is substantially equal to the depth of the concentration peak of the second impurity.

4. A process for manufacturing a semiconductor device as defined in claim 1 wherein the peak concentration of the first impurity exceeds about $10^{20}$ cm$^{-3}$.

5. A process for manufacturing a semiconductor device as defined in claim 1 wherein each said step of introducing is carried out by ion implantation.

6. A process for manufacturing a semiconductor device is defined in claim 1 wherein the first impurity is at least one of P, As and Sb.

7. A process for manufacturing a semiconductor device as defined in claim 6 wherein the second impurity is Cl, O, Br, S, I or N.

8. A process for manufacturing a semiconductor device as defined in claim 1 wherein the second impurity is Cl, O, Br, S, I or N.

9. A process for manufacturing a semiconductor device as defined in claim 8 wherein the profile of the second impurity is shallower than the profile of the first impurity, and the peak concentration of said second impurity is lower than the peak concentration of said first impurity.

10. A process for manufacturing a semiconductor device as defined in claim 1 wherein the profile of the second impurity is shallower than the profile of the first impurity, and the peak concentration of said second impurity is lower than the peak concentration of said first impurity.

* * * * *